United States Patent
Carinci et al.

(10) Patent No.: US 10,996,302 B2
(45) Date of Patent: May 4, 2021

(54) MOTION-STABLE SLICE MULTIPLEXING METHOD

(71) Applicant: Siemens Healthcare GmbH, Erlangen (DE)

(72) Inventors: Flavio Carinci, Wadgassen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/695,242

(22) Filed: Nov. 26, 2019

(65) Prior Publication Data

US 2020/0166594 A1 May 28, 2020

(30) Foreign Application Priority Data

Nov. 27, 2018 (DE) .......................... 102018220348.2

(51) Int. Cl.
*G01R 33/483* (2006.01)
*G01R 33/561* (2006.01)
*G01R 33/32* (2006.01)
*G01R 33/00* (2006.01)

(52) U.S. Cl.
CPC ..... *G01R 33/4835* (2013.01); *G01R 33/0017* (2013.01); *G01R 33/32* (2013.01); *G01R 33/561* (2013.01)

(58) Field of Classification Search
USPC ....................................................... 324/309
See application file for complete search history.

(56) References Cited

U.S. PATENT DOCUMENTS

| 10,557,903 B2 * | 2/2020 | Carinci .............. G01R 33/4835 |
| 2018/0074147 A1 | 3/2018 | Carinci et al. |
| 2018/0095150 A1 | 4/2018 | Zeller |
| 2018/0217219 A1 | 8/2018 | Beck et al. |

(Continued)

FOREIGN PATENT DOCUMENTS

| DE | 102016218955 A1 | 4/2018 |
| DE | 102017201477 A1 | 8/2018 |
| EP | 3460501 A1 | 3/2019 |

OTHER PUBLICATIONS

Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011)// DOI 10.1002/mrm.23097.

(Continued)

*Primary Examiner* — Rodney E Fuller
(74) *Attorney, Agent, or Firm* — Schiff Hardin LLP

(57) ABSTRACT

Reference data is acquired by a slice multiplexing technique on the basis of which calibration data is determined and used to separate measurement data that has been acquired in collapsed form also by a slice multiplexing technique from at least two slices and still has to be separated into single-slice measurement data. As a result, both the reference data and the measurement data to be separated are acquired from several slices simultaneously in each case and hence during the same physiological state of motion in each case. This reduces the sensitivity to motion of a separation of the measurement data performed on the basis of the reference data.

16 Claims, 7 Drawing Sheets

(56) References Cited

U.S. PATENT DOCUMENTS

2018/0348323 A1    12/2018   Carinci et al.
2019/0094321 A1     3/2019   Carinci et al.

OTHER PUBLICATIONS

Breuer, Felix A. et al. "Controlled Aliasing in Parallel Imaging Results in Higher Acceleration (CAIPIRINHA) for Multi-Slice Imaging" Magnetic Resonance in Medicine; vol. 53; pp. 684-691; 2005.

Zahneisen, Benjamin et al. "Three-Dimensional Fourier Encoding of Simultaneously Excited Slices: Generalized Acquisition and Reconstruction Framework" Magnetic Resonance in Medicine, vol. 71, No. 6, pp. 2071-2081, Jun. 2014 // https://doi.org/10.1002/mrm.24875.

Examination Report dated Aug. 12, 2019 for German Application No. 10 2018 220 348.2.

\* cited by examiner

FIG 1
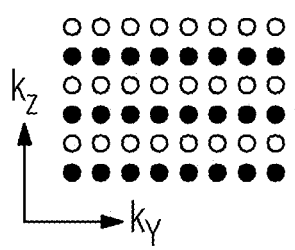
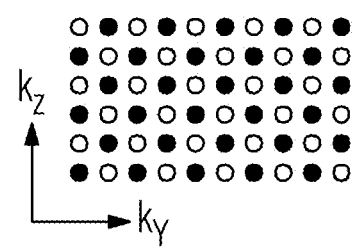

MOTION-STABLE SLICE MULTIPLEXING METHOD

CROSS REFERENCE TO RELATED APPLICATIONS

This patent application claims priority to German Patent Application No. 102018220348.2, filed Nov. 27, 2018, which is incorporated herein by reference in its entirety.

BACKGROUND

Field

The disclosure relates to a method for generating measurement data from at least two non-overlapping sub-volumes of an object under examination by means of magnetic resonance technology, which is stable with respect to motions of the object under examination.

Related Art

Magnet resonance (hereinafter the abbreviation MR stands for magnetic resonance) is a known technology which can be used to generate images of the inside of an object under examination. In simple terms, this is done by placing the object under examination in a magnetic resonance device in a comparatively strong static homogeneous basic magnetic field, also called the Bo field with field strengths of 0.2 tesla to 7 tesla and higher with the result that the nuclear spins thereof are oriented along the basic magnetic field. Radio-frequency excitation pulses (RF pulses) are applied to the object under examination in order to induce nuclear spin resonances, the induced nuclear spin resonances are measured as so-called k-space data and MR images are reconstructed or spectroscopic data is ascertained therefrom. For spatial coding of the measurement data, the basic magnetic field is superimposed with rapidly switched magnetic gradient fields. The recorded measurement data is digitized and entered as complex numerical values in a k-space matrix. An associated MR image can be reconstructed from the k-space matrix populated with values, for example by means of a multidimensional Fourier transform.

The requirement for ever faster MR acquisitions in the clinical environment is currently leading to a renaissance of methods in which a plurality of images are acquired simultaneously. In general, these methods can be characterized in that transverse magnetization of at least two slices is specifically used simultaneously for the imaging process ("multislice imaging", "slice multiplexing") at least during a portion of the measurement. In contrast to this, in the established "multislice imaging" method, the signal is acquired from at least two slices in alternation, i.e. completely independently of one another with a correspondingly longer measurement time.

Known methods for this purpose are, for example, so-called Hadamard coding, methods with simultaneous echo refocusing, methods with broadband data acquisition or also methods that use parallel imaging in the slice direction. The last-mentioned methods also include, for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp 684-691 and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp 1210-1224.

In particular, the last-mentioned slice multiplexing method frequently uses a so-called multiband RF pulse in order to excite or otherwise manipulate, for example refocus or saturate, two or more slices simultaneously. Herein, such a multiband RF pulse is for example a multiplex of individual RF pulses that would have been used to manipulate the individual slices to be manipulated simultaneously. The multiplexing results in, for example, a baseband-modulated multiband RF pulse from an addition of the pulse waveforms of the individual RF pulses. Herein, the spatial encoding of the acquired signals is substantially achieved by conventional gradient switching in two directions (two-dimensional gradient encoding). However, it is also possible in each case to use individual, for example successively switched, RF pulses to excite and manipulate the slices to be excited from which echo signals are acquired simultaneously and jointly in one measurement data acquisition. It is also possible to use "single slice" RF pulses and multiband RF pulses in combination.

The resultant signals are acquired by means of a plurality of receive antennas from all the excited slices in collapsed form in one dataset and then separated according to the individual slices using parallel acquisition techniques.

Such parallel acquisition techniques (PPA techniques), which can generally be used to reduce the time required to acquire the desired data by incomplete sampling, i.e. undersampling, of the k-space according to the Nyquist criterion, include for example GRAPPA ("GeneRalized Autocalibrating Partially Parallel Acquisition") and SENSE ("SENSitivity Encoding"). With parallel acquisition techniques, the non-measured measurement points in the k-space in the context of the undersampling parallel acquisition techniques are generally uniformly distributed over the k-space to be measured according to the Nyquist criterion such that, for example, only every other k-space line is measured. In addition, with parallel acquisition techniques, the "missing" k-space data is reconstructed using coil sensitivity data. This coil sensitivity data for the receive coils used for the acquisition of measurement data is ascertained from reference data, which samples at least one region of the k-space that is to be measured, generally the central region, completely according to the Nyquist criterion.

Slice multiplexing methods use parallel acquisition techniques for re-separating the measurement data acquired simultaneously for different slices. Herein, reference data has to be acquired for all the slices concerned. This generally takes place in the context of a reference measurement to be performed additionally and which measures the reference data individually for each desired slice.

In order to be able to separate the resultant signals from the different slices, a different phase is, for example, in each case impressed on the individual RF pulses before the multiplexing, for example by adding a phase that increases linearly (for example with the k-space coordinate in the phase-encoding direction ($k_y$)). Thus, a different phase gradient can be impressed on each slice thereby shifting the slices in the image domain with respect to one another. This shift is controlled by the so-called ("FOV (field of view) shift factor"). The way to determine an optimum FOV shift factor is, for example, described in DE102016218955.

In the CAIPIRINHA method described in the cited articles by Breuer et al. and Setsompop et al., alternating phase shifts are impressed between the simultaneously excited slices by switching additional gradient blips or by additional phase modulation of the RF pulses (multiband RF pulses) to generate further shifts in the image domain. These additional shifts in the image domain, also called "interslice FOV shifts", improve the quality of the separation of the signals from the slices, in particular, if the coil sensitivities exhibit such small differences in the sensitivity profiles of the individual coils used that they are inadequate for reliable separation of the slices. Hence, this reduces artifacts in the image data ultimately reconstructed from the measured measurement data.

FIG. 1 shows by way of example a comparison of different sampling patterns of the k-space for GRAPPA-like parallel imaging techniques, each having an acceleration factor 2 and a three-dimensional (3D) Cartesian sampling pattern, which in each case samples k-space lines in the ky-kx plane. Herein, the kx direction, in which the k-space lines extend in the example, lies perpendicular to the plane of the page and the sampling pattern is always the same in the kx direction. The filled circles represent measured k-space points, the empty circles represent omitted k-space points. The sampling pattern on the left shows a conventional GRAPPA sampling in which every second k-space line in one spatial direction (here: the kz direction) is omitted and hence only half the k-space points are measured.

The effect of the additional phase shifts on the sampling pattern of a two-dimensional (2D) slice multiplexing measurement can be described as follows (see right side of FIG. 1): the additional phases, which are impressed in the CAIPIRINHA slice multiplexing method, shift the measurement points to which the additional phase is applied by a shift in the k-space in the kz direction. The size of this shift in the kz direction depends upon the phase impressed. This is also described, for example, in the article by Zahneisen et al.: "Three-Dimensional Fourier Encoding of Simultaneously Excited Slices: Generalized Acquisition and Reconstruction Framework", Magn. Reson. Med. 71, pp 2071-2081 (2014).

To date, the reference data from which sensitivity data or calibration data is obtained in order to separate the simultaneously acquired slices and/or to replenish missing measurement data has to be measured additionally for every SMS measurement. The additional acquisition of the reference data increases the overall acquisition time required and the SAR load (SAR: "specific absorption rate") when using a slice multiplexing method and hence reduces the advantages actually sought with these methods, namely reduced measurement time and SAR load compared with single-slice methods.

Moreover, differences between the measurement parameters used in the acquisition of the reference data and the measurement parameters used with slice multiplexing measurements, in particular measurement parameters relating to the properties of the RF excitation pulses and/or relating to the readout process, such as, for example, the readout bandwidth, can affect the quality of the separation of the slices and result in unwanted artifacts. In this context, the subsequently published US patent application US 20180074147A1 already describes different methods for obtaining such reference data alongside the slice multiplexing measurement data, wherein the reference data still has to be acquired in addition to the measurement data.

In particular when measurement data is to be acquired from a region of interest of an object under examination that is subjected to a motion of the object under examination, such as, for example, is in particular the case with abdominal imaging in which the abdomen of a patient is moved by a respiratory motion of the patient, a motion-induced difference between a (slice) position of reference data acquired separately for each slice and a (slice) position of one of the plurality of slices acquired in collapsed form of a measurement dataset to be separated by means of the reference data can result in artifacts because the measurement data that was recorded in collapsed form for a plurality of slices is acquired at the same state of motion for all simultaneously acquired slices, while the reference data for the individual slices was generally acquired at different states of motion of the region of interest.

In order to be able to separate the measurement data of the plurality of slices acquired in collapsed form into measurement data for individual slices with the minimum amount of interference, the acquisition of the reference data for the individual slices should be performed using the same slice position and slice orientation as the measurement data acquired simultaneously in a slice multiplexing measurement. If the position or location of a slice to be acquired changes during the course of an MR measurement, for example due to an involuntary motion of the object under examination, in particular during the acquisition of measurement data in regions of interest moved by a (constant) physiological motion of the object under examination, reference data for the slices to be acquired must be acquired for each location and/or position altered by the physiological motion in each case and in each case the reference data for the slices affected used for the separation of measurement data acquired in collapsed form should be that acquired at the same altered location and/or position in order to continue to be able to ensure that the slices are separated correctly.

However, such multiple acquisitions of reference data (one for each altered position and/or location) are not always possible and in each case entail the aforementioned disadvantages (prolongation of the overall measurement time/SAR load). Dispensing with re-acquisition of reference data diminishes the quality of the separation of the measurement data for the individual slices resulting in artifacts in the MR data ultimately acquired.

DE102017201477 describes a method that detects a motion of the object under examination and takes account of the motion determined in recalculating local weighting matrices used for the slice separation and/or the replenishment of slice measurement data. To do this however, the reference data to be acquired for the weighting matrix must cover a larger volume than would be necessary without this recalculation. Furthermore, the recalculation requires complex calculation steps and is hence not easy to implement.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 shows a schematic comparison of different sampling patterns of the k-space for parallel acquisition techniques.

Figure 2:
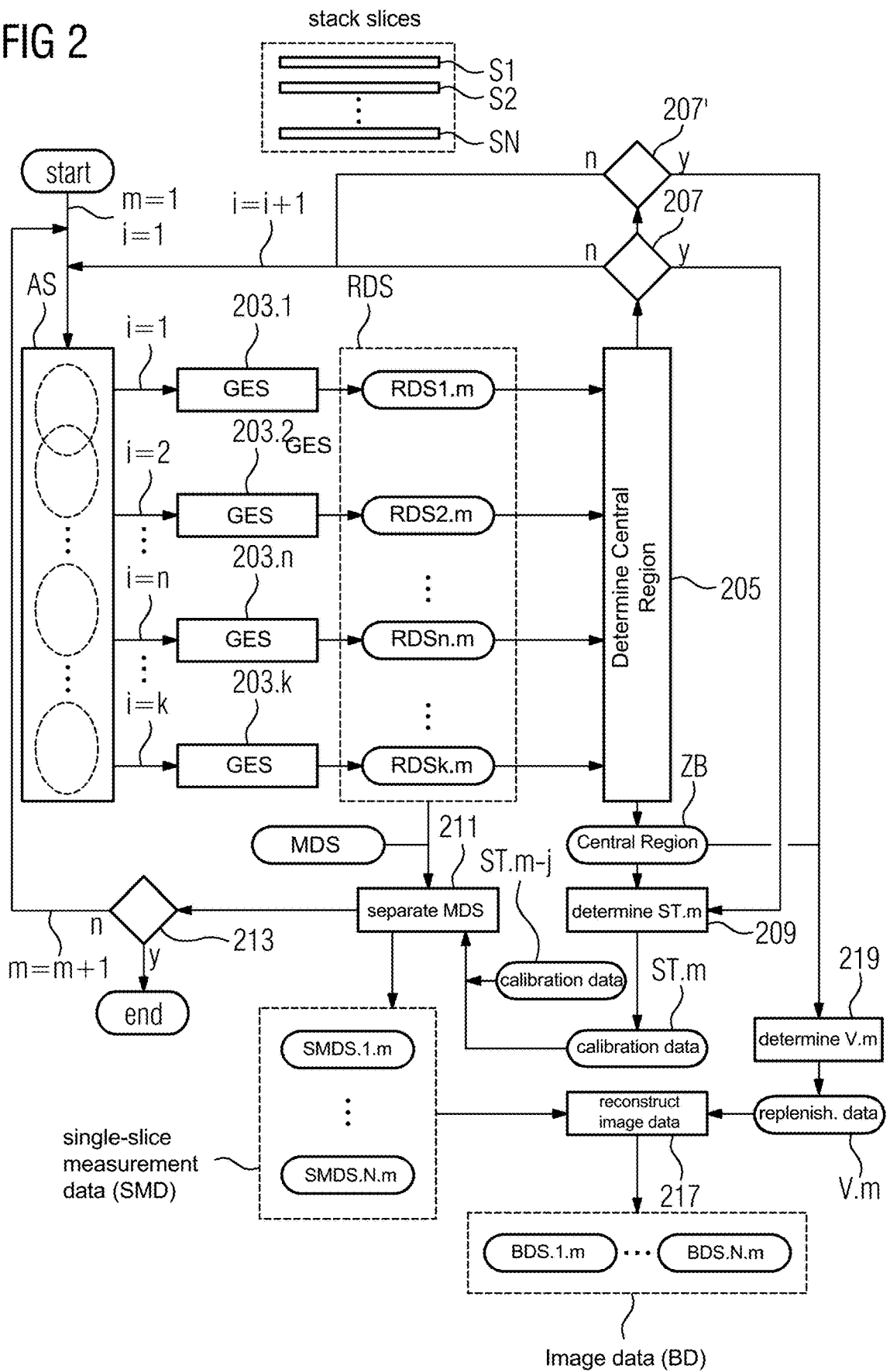
FIG. 2 shows a flowchart of a method to generate measurement data according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide a slice multiplexing method that is still robust in the case of motion of the region of interest, avoids artifacts efficiently and ensures high image quality.

The object is achieved by aspects of the present disclosure, including a method for generating measurement data of an object under examination using a magnetic resonance technique, a magnetic resonance system, a computer program, and an electronically readable data carrier, according to exemplary embodiments of the present disclosure.

A method according to an exemplary embodiment of the disclosure for generating measurement data from an object under examination subjected to a physiological motion by means of a slice multiplexing magnetic resonance technique includes the steps:
  a) repeatedly applying at least one RF excitation pulse and switching gradients such that echo signals are generated in at least two slices by the switched gradients and the applied RF excitation pulses echo signals and such that the echo signals generated are acquired in the k-space and stored as reference data in one respective reference dataset per repetition in accordance with one respective different three-dimensionally viewed sampling pattern per repetition, wherein each sampling pattern is undersampled according to the Nyquist criterion and wherein, at least in a central region, a combination of the sampling patterns used in the repetitions, at least in the slice direction (kz), completely includes the k-space,
  b) determining calibration data in order to separate measurement data acquired in collapsed form from at least two slices on the basis of the, at least in the slice direction, complete central region of the combined reference datasets
  c) separating measurement data acquired in collapsed form from at least two slices, in particular measurement data acquired in collapsed form from the at least two slices, into single-slice measurement data using the calibration data.

As further described in the aforementioned article by Zahneisen et al., selecting the desired shift in the image domain as a multiple of the Nth part of the field of view FOV (with N simultaneously excited slices) results in a shift of the measured k-space points in the k-space (in the kz direction) by an amount corresponding to complete Nyquist sampling in this k-space direction. Hence, a 2D slice multiplexing measurement can be viewed in an analogous way to a 3D CAIPIRINHA measurement.

An aspect of the present disclosure is based on the finding that viewing a measurement as a 3D measurement, and hence also viewing the sampling pattern used for slice multiplexing as a 3D sampling pattern, provides a simple-to-implement possibility for selecting different sampling patterns that, although they undersample the k-space individually, in combination, at least in a central region, at least in the slice direction, completely sample the k-space.

According to aspects of the disclosure, therefore, reference data is acquired by means of a slice multiplexing technique on the basis of which calibration data is determined that is used to separate measurement data acquired in collapsed form also by means of a slice multiplexing technique from at least two slices and is then to be separated into single-slice measurement data. As a result, both the reference data and the measurement data to be separated are in each case acquired simultaneously, and hence during the same physiological state of motion in each case, from a plurality of slices. This reduces the sensitivity to motion of a separation of the measurement data on the basis of the reference data.

Herein, the use of a procedure that involves reference data being acquired in each case from the same at least two slices from which measurement data is also acquired in collapsed form ensures that, to separate measurement data acquired during a physiological state of motion, reference data is used that, like the measurement data, was likewise acquired during the same physiological state of motion, thus further reducing the influence of the physiological motion on the quality of the separation since both reference data and measurement data are influenced in the same, or at least a similar, way by the state of motion.

Hence, the method according to an exemplary embodiment of the disclosure permits effective compensation of physiological motions and therefore, even in the case of a free physiological motion, in particular, for example, free respiration, of the object under examination permits the stable separation of measurement data acquired in collapsed form from a plurality of slices into single-slice measurement data. As a result, artifacts are also avoided in image data that can be reconstructed from the single-slice measurement data. It is pleasant for a patient as an object under examination to be able to breathe freely during an MR examination. The method according to the disclosure permits this with a high quality of the image data ultimately obtained.

Herein, the, at least in the slice direction, complete central region of the combined reference datasets used during the determination of the calibration data to separate measurement data acquired in collapsed form from at least two slices can be undersampled in the phase-encoding direction. Hence, herein it is sufficient to acquire less reference data than would be necessary for full sampling. This enables time and computing effort to be saved on the acquisition of the reference data and the determination of the calibration data without any adverse effect on the quality of the separation.

Reference datasets acquired in the context of the method according to exemplary embodiments can be used directly as measurement data acquired in collapsed form from the at least two slices to be separated and separated into single-slice measurement data from which single-slice images can be reconstructed. If reference data is acquired as measurement data to be separated on the basis of the reference data, it is on the one hand ensured that the reference data was acquired during the same physiological state of motion, and, on the other, there is no need for a separate measurement of reference data since this data already embodies the measurement data to be separated. This enables measurement time to be saved and the SAR load for the object under examination to be kept low.

At least one further repetition of the generation of echo signals in the at least two slices and the acquisition and storage thereof in each case as reference data in a respective further reference dataset with a sampling pattern that has already been used previously can be performed. Further calibration data can be created on the basis of the further reference datasets. The further calibration data can be used as current calibration data. The further calibration data can also be determined taking account of previously determined calibration data in that, for example, the calibration data is averaged with the further calibration data. Averaging can, for example, average out noise-based errors in the calibration data.

Such a repetition can in particular be performed with all the sampling patterns that have already been used previously hence enabling a complete set of further reference data to be obtained.

If the above-described step a) is repeated frequently enough with the application of different RF excitation pulses and switching of different gradients in accordance with a respective different three-dimensionally viewed sampling pattern to ensure that a combination of the sampling patterns employed in all the repetitions, at least in a central region, completely includes the k-space, the completely acquired central region can be used as the basis for determining replenishment data for replenishing incomplete single-slice measurement data in the phase encoding direction.

If diffusion-weighted measurement data is to be separated, reference datasets can be acquired with different diffusion directions and/or b-values for the different weightings employed during the acquisition of the measurement data. As a result of the different diffusion weightings to be acquired, the acquisition of diffusion-weighted measurement data requires longer measurement times per se. Therefore, diffusion-weighted measurement data is preferably acquired with an inherently fast pulse sequence, such as, for example, of the echo planar (EPI) sequence type. The reference data can be acquired with the same type of EPI sequence.

If diffusion-weighted measurement data is to be separated, reference datasets can be acquired with the smallest b-values corresponding at the most to the number of the at least two slices from which measurement data is acquired in collapsed form for b-values used for the diffusion weighting of the measurement data to be separated. Hence, in the case of measurement data acquired in collapsed form from N slices, the reference data has at the most only the N lowest b-values for the diffusion weightings. The low diffusion weightings of the reference data enable calibration data to be created from reference data with a different diffusion weighting, i.e. for example with different diffusion directions and/or different b-values, thus saving on repetitions with further diffusion values requiring further measurement time.

Herein, the different sampling patterns employed can in each case have identical undersampling and an identically impressed, in terms of amount, shift in the image domain in the slice direction thus making implementation easier.

Sampling patterns according to exemplary embodiments of the disclosure can be located particularly easily by permutation of an initial sampling scheme. Hence, the different sampling patterns employed differ from one another by a permutation, in particular a cyclic permutation. Herein, in particular the positions of the measurement points in the k-space can be permutated, wherein these measurement points are exposed to an additional phase in order to impress a shift in the image domain in the slice direction.

A magnetic resonance system according to an exemplary embodiment of the disclosure includes a magnet, a gradient field generator, a radio-frequency unit and a controller with a radio-frequency transmission/reception controller and a calibrator embodied to carry out a method according to the disclosure.

A computer program according to the disclosure implements a method according to the disclosure on a controller when it is executed on the controller.

Herein, the computer program also be present in the form of a computer program product, which can be loaded directly into a memory of a controller, with program code means for carrying out a method according to the disclosure when the computer program product is executed in the processor of the computing system.

An electronically readable data carrier according to the disclosure includes electronically readable control information stored thereupon, which at least includes a computer program according to the disclosure and is embodied such that it carries out a method according to the disclosure when the data carrier is used in a controller of a magnetic resonance system.

The advantages and embodiments relating to the method also apply analogously to the magnetic resonance system, the computer program product and the electronically readable data carrier.

FIG. 2 is a schematic flowchart of a method according to an exemplary embodiment of the disclosure for generating measurement data from an object under examination subjected to physiological motion by means of a slice multiplexing magnetic resonance technique.

After the start ("start") of a method according to the disclosure, initially at least two different, when three-dimensionally viewed, sampling patterns AS can be determined in accordance with which reference data RDS for N non-overlapping slices is to be acquired. Herein, a three-dimensional view should be understood to mean a view of the sampling patterns in a three-dimensional k-space, i.e. in all three k-space directions, which define the k-space positions at which measurement points lie. Each of the sampling patterns AS is undersampled according to the Nyquist criterion, at least in the three-dimensional view. However, the sampling patterns AS are selected such that they define measurement points in the k-space in such a way that, in combination, the measurement points in the k-space that are sampled in each of the n sampling patterns fully sample the k-space at least in a desired central region at least in the slice direction.

Herein, the sought different sampling patterns AS to be employed can be obtained by permutation of certain features of an initial sampling pattern as a result of which the different sampling patterns AS to be employed differ from one another by this permutation. Herein, in particular an initial sampling pattern can permutated in accordance with k-space positions populated by additional phases thus enabling suitable sampling patterns to be created in a particularly easy manner, which in addition in each case have identical undersampling and impressed shift in the image domain in the slice direction. A selection of the different sampling patterns AS to be employed such that in each case they have identical undersampling (acceleration both by collapsed acquisition of measurement data from a plurality of slices and within slices) and impressed shift of the slices in the image domain (interslice FOV shift) makes it easier to compare the image data that is ultimately reconstructed.

N slices of an object under examination are selectively excited by applying at least one RF excitation pulse and by switching gradients such that echo signals are generated in the N slices. The applied RF excitation pulses can be at least one multiband RF excitation pulse or RF excitation pulses, which in each case excite one slice of the N slices, or a combination of at least one multiband RF excitation pulse and RF excitation pulses, which in each case excite one slice of the N slices.

The applied RF excitation pulses and switched gradients acquire the generated echo signals in accordance with a first sampling pattern AS i=1 as reference data RDS that is stored in a reference dataset RDS1.m (block 203.1). A central region ZB (block 205) is determined from reference data of the stored reference data RDS in that the reference data of the reference datasets RDS lying in the desired central region ZB of the k-space is collected. If complete reference data is not yet available in the central region ZB of the k-space in the slice direction and therefore reference datasets RDS have not yet been acquired in accordance with all the sampling patterns AS provided for this purpose (query 207, n), the acquisition of a new reference data set RDS for the N slices is repeated in accordance with a sampling pattern i=i+1 that has not yet been performed.

The acquisition of reference datasets RDS for the N slices is performed for a total of n (n>1) times, wherein, on each repetition i, RF excitation pulses are applied in such a way and gradients are switched such that in each case a different three-dimensionally viewed sampling pattern AS is obtained (blocks 203.i) and in each case reference datasets RDSi.m (i=1, 2, . . . , n) for the N slices are acquired.

If reference datasets RDS have already been acquired in accordance with all the sampling patterns AS provided for the complete filling of the central region ZB of the k-space in the slice direction (query 207, y) and hence a complete set of reference data is available in the combined reference datasets RDS in the central region ZB of the k-space in the slice direction, the, at least in the slice direction, complete central region of the combined reference datasets can be used as the basis, for example using a parallel acquisition technique known for the separation of measurement data acquired in collapsed form from a plurality of slices, for determining calibration data ST.m for the separation of measurement data acquired in collapsed form MDS from the N slices (block 209). The calibration data ST.m can be used to separate measurement data MDS acquired in collapsed form from the N slices into single-slice measurement data SMDS.1.m . . . SMDS.N.m for the respective individual slices 1 to N (block 211). The quality of the separation of the measurement data acquired in collapsed form by means of calibration data ST.m created on the basis of the reference data RDS is particularly high when the measurement data MDS is acquired in collapsed from the (same) at least two slices acquired in collapsed form from which the reference data RDS was also acquired in collapsed form.

It is also possible to separate the actual acquired reference datasets RDS as measurement data MDS acquired in collapsed form from the at least two slices to be separated into single-slice measurement data SMDS.1.m . . . SMDS.N.m. Hence, if the acquired reference datasets RDS are identical to the measurement data to be separated MDS, it is not necessary to acquire measurement data MDS and reference datasets RDS separately. This saves measurement time. In addition, measurement data MDS and reference datasets RDS are ideally matched to one another if they are identical and were therefore recorded under exactly the same conditions.

The, at least in the slice direction, complete central region ZB of the combined reference datasets RDS used during the determination of the calibration data ST.m to separate measurement data acquired in collapsed form from the at least two slices can advantageously be undersampled in the phase encoding direction. As a result, less reference data needs to be acquired to fill the central region sufficiently (only completely in the slice direction).

If the single-slice measurement data SMD created by the separation (block 211) is incomplete according to the Nyquist criterion, it can be provided that further repetitions i are performed so that the application of at least one RF excitation pulse and switching of gradients such that the switched gradients and the applied RF excitation pulses generate echo signals in at least two slices and such that the generated echo signals are acquired as reference data in one respective reference dataset per repetition (blocks 203.i) are repeated with the application of different RF excitation pulses and switching of different gradients in accordance with a respective different three-dimensionally viewed sampling pattern AS until a combination of the sampling patterns AS employed in all the repetitions (i=1 to k; k>n) completely includes the k-space at least in a central region ZB.

If complete reference data is not yet available in the central region ZB of the k-space and, therefore, reference datasets RDS have not yet been acquired in accordance with all the sampling patterns AS provided for this purpose (query 207', n), the acquisition of a new reference data set RDS for the N slices is repeated in accordance with a sampling pattern i=i+1 that has not yet been performed.

If reference datasets RDS have already been acquired in accordance with all the sampling patterns AS provided for such a complete filling of the central region ZB of the k-space (query 207', y) and hence a, in the slice direction, complete set of reference data is available in the combined reference datasets RDS in the central region ZB of the k-space, such a completely acquired central region ZB can be used as the basis for determining replenishment data V.m (block 219) for replenishing incomplete single-slice measurement data SMD.

Replenishment data V.m determined in this way has the same advantages for the replenishment as those applicable to the calibration data ST.m created in the manner described herein.

Such replenishment data V.m, or also replenishment data determined in another way (not depicted) can be used to replenish subsampled single-slice measurement data SMDS.1.m . . . SMDS.N.m in each case, for example using a 2D parallel acquisition technique to produce complete single-slice measurement data from which in each case image data BDS.1.m . . . BDS.N.m can be reconstructed for each of the N slices and also for each repetition m (block 217). If the separated single-slice measurement data is already complete, the replenishment before the reconstruction can be dispensed with. If image data is created for a plurality of repetitions m, image data from the same slice but different repetitions m, for example BDS1.1 and BDS1.2 for slice 1 and m=2, can be processed with one another to produce mixed image data, for example by averaging (not depicted).

If all the desired measurement data acquired in collapsed form MDS have already been separated into single-slice measurement data SMDS.1.m . . . SMDS.N.m (query 213, y), the method can end ("end").

If all the desired measurement data acquired in collapsed form MDS has not yet been separated into single-slice measurement data SMDS.1.m . . . SMDS.N.m (query 213, n), for example new measurement data MDS has been acquired in collapsed form, the acquisition of reference data RDSi.m in accordance with desired sampling patterns AS (blocks 203.i) and the separation of the measurement data MDS (block 211) for at least one sampling pattern can be repeated. The counter m is increased by one (m=m+1).

If calibration data ST.m-j has been determined in this way at least once, it is possible, in particular after each acquisition of reference datasets RDSi.m, for current calibration data ST.m used for the separation of measurement data acquired in collapsed form MDS to be determined from current reference data of the reference datasets RDSi.m. This is in particular advisable if current measurement data MDS has been acquired, for example in the form of the further reference datasets RDSi.m.

This enables at least one further repetition to be performed of the generation of echo signals in the at least two slices and the acquisition and storage of these in each case as reference data in a respective further reference dataset RDSi.m (m>1) with a sampling pattern that has already been used before, in particular with all sampling patterns that have already been used before, and the stored further reference datasets RDSi.m (m>1) to be used for the determination of further calibration data ST.m (m>1) to separate measurement data acquired in collapsed form from at least two slices.

The determination of the further calibration data ST.m (m>1) can take place taking account of previously determined calibration data ST.m-j. For example, reference data RDS acquired in each case in a current last acquisition of reference data 203.i for a reference dataset RDSi.m can directly replace reference data acquired for the same k-space position in an earlier acquisition of reference data for a previous reference dataset RDSi.m-j (j=1, . . . , m−1) in the calibration data ST.m-j in order to obtain further calibration data ST.m. Previously determined calibration data ST.m-j can also be taken into account in that initially calibration data ST-m' (not depicted) can be determined from further reference datasets RDSi.m which with at least one set of previously determined calibration data ST-m-j is averaged in order to obtain the current calibration data ST.m.

In this way, constantly updated calibration data ST.m also always ensures, for the separation of measurement data acquired in collapsed form MDS, calibration data ST.m that is optimally adapted to the acquired measurement data MDS.

Figure 3:
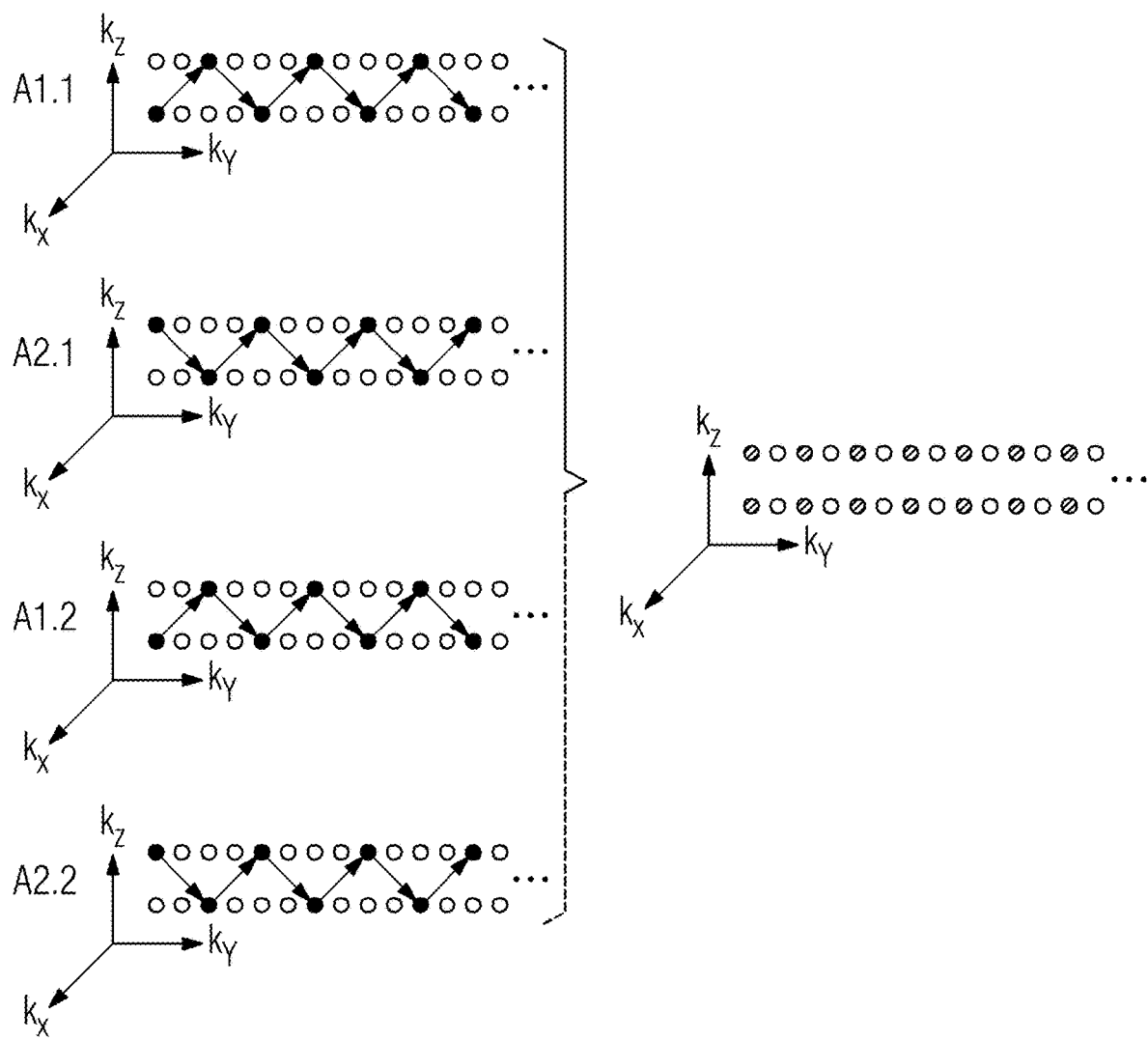
FIG. 3 shows different sampling patterns according to an exemplary embodiment of the disclosure.

A simple example of n=2 different sampling patterns to be employed ASi.m and two repetitions m for a collapsed acquisition of reference data from two slices is illustrated in FIG. 3, which shows, by way of example, the principle of k-space sampling with a field of view shift factor of $$\frac{FOV}{4}$$

for a first acquisition (i=1, m=1) with the sampling pattern A1.1 shown at the top and repetitions of the acquisition (i=2, m=1; i=1, m=2; i=2, m=2) with the sampling patterns A2.1, A1.2, A2.2 shown below this. Herein, as in FIG. 1, the $k_x$ direction is perpendicular to the plane of the page. Hence, FIG. 3 depicts a Cartesian sampling pattern. The method can also be employed analogously with non-Cartesian sampling patterns, for example radial or spiral sampling patterns.

As in FIG. 1, in FIG. 3 acquired k-space points are depicted as black-filled circles, while non-acquired k-space points are depicted as white-filled circles. In the first acquisition depicted at the top in accordance with the sampling pattern A1.1, in the $k_y$ direction every fourth k-space point is shifted in the kz direction by additionally impressed phases $\phi_1$. This can, for example, be achieved by employing a CAIPIRINHA technique. In the repetition shown in the following line in accordance with the sampling pattern A2.1, the additional phases $\phi_i$ are changed such that, again in the $k_y$ direction, every fourth k-space point is shifted in the kz direction by additionally impressed phases $\phi_2$, however in the repetition i=2, the k-space points shifted in the kz direction are those that were acquired in the first acquisition at a coordinate in the phase encoding direction $k_y$, but were not shifted in the slice direction $k_z$. Hence, in the example shown, simple permutation of the k-space points populated with additional phases $\phi_i$ enables sampling patterns to be obtained that differ when viewed three-dimensionally and which, in combination, in the slice direction, fully sample the k-space.

The further sampling patterns A1.2 and A2.2 shown are repetitions of the sampling patterns A1.1 and A2.1. Reference data acquired in accordance with the sampling patterns A1.1 and A2.1 and/or A1.2 and A2.2 can be used to fill at least one central region of the k-space, as shown on the right in FIG. 3, wherein k-space points depicted as hatched are filled. For this, it is, for example, possible for the reference data measured in accordance with the sampling patterns A1.1 and A2.1 or the reference data measured in accordance with the sampling patterns A1.2 and A2.2 or all the measured reference data to be combined, for example, by averaging. Further repetitions m that can be performed in accordance with the same pattern can be provided.

If a slice multiplexing method is used to create diffusion-weighted measurement data, the acquisition of the reference data also be diffusion-weighted. For example, reference data, which is acquired with the different sampling patterns Ai.m depicted can also be acquired employing diffusion weighting in accordance with at least one diffusion parameter (b-value and diffusion direction). Herein, in particular in repetitions with the same index m, it is possible to employ the same diffusion weighting, but, in repetitions with a different index m, it is also possible to use different diffusion weightings. In particular, it is possible, in accordance with their b-value, for small diffusion weightings employed on the acquisition of the measurement data also to be employed on the acquisition of the reference data, for example in accordance with b-values between b=0 and b=100, in particular in accordance with b-values between b=0 and b=50.

If the reference data is already acquired as measurement data to be separated in accordance with a diffusion-weighted acquisition technique, for example a slice multiplexing EPI technique, a further acquisition of measurement data with the b-values already employed for the reference data can be dispensed with. In addition, calibration data created on the basis of reference data acquired in the repetitions m can be averaged to improve robustness with respect to physiological motions of the object under examination without this necessitating additional acquisitions for the averaging since the acquisitions for the diffusion weighting already have to be repeated (with different b-values and/or diffusion directions) and use can be made of these repetitions. Hence, the overall measurement time is not prolonged by repetitions m.

Figure 4:
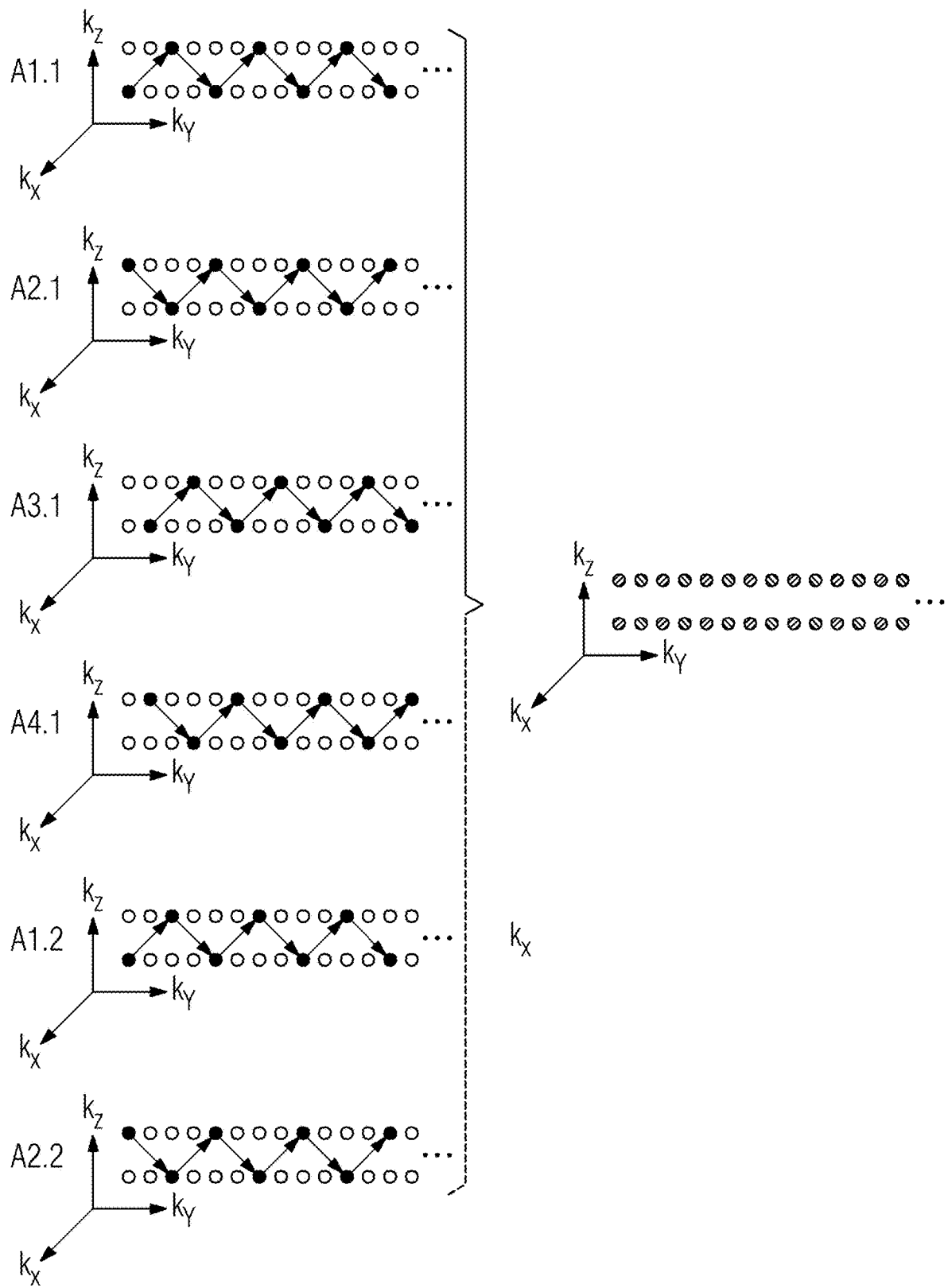
FIG. 4 shows different sampling patterns according to an exemplary embodiment of the disclosure.

FIG. 4 is a schematic depiction of different sampling patterns (i=1, i=2, i=3 and i=4 (n=2 k=4)), once again for two repetitions m, according to an exemplary embodiment of the disclosure. Once again, this is not intended to depict a restriction to only two repetitions m. Any number of repetitions m can be provided that in each case take place according to the pattern depicted. The number of repetitions m can increase the robustness of the calibration data and/or replenishment data created in particular by averaging over all the repetitions m. For this purpose, on the one hand, the reference data acquired in the repetitions in each case with the same sampling pattern AS can be averaged or it is also possible for the calibration data created in each case after each repetition m to be averaged.

The sampling patterns Ai.m correspond in each case to sampling patterns with acceleration factors SMS=2 (i.e. collapsed acquisition of reference data from two slices) and PPA=2 (i.e. within the slices, only half of the measurement points required according to the Nyquist criterion are measured, the other half is to be replenished by means of parallel acquisition techniques) and were determined for different i by cyclic permutation of the k-space positions to be exposed to additional phases $\phi i$ in the ky direction.

According to the sampling patterns Ai.1 and Ai.2 shown in FIG. 4, a combination (at least in a desired central region of the k-space) in each case results (in the combined region) in a complete set of reference data from which calibration data and/or replenishment data can be determined according to the disclosure.

As in the example already shown in FIG. 3, a combination of reference data acquired in accordance with sampling pattern A1.1 and in accordance with sampling pattern A2.1 and in accordance with sampling pattern A1.2 and in accordance with sampling pattern A2.2 or a combination of the reference data acquired in the m repetitions for i=1 and i=2 completely fill the k-space (at least in a central region) in the slice direction. The k-space points in this way are shown as hatched in the depiction of the k-space shown on the right going from the bottom left to the top right.

In contrast to the example shown in FIG. 3, however, FIG. 4 provides further sampling patterns i=3 and i=4, which once again completely fill (at least) the central region of the k-space by a combination of reference data acquired in accordance with sampling pattern A3.1 and in accordance with sampling pattern A4.1 (and optionally reference data acquired in accordance with sampling pattern A3.2 and in accordance with sampling pattern A4.2 or a combination of the reference data acquired in the m repetitions for i=3 and i=4) in the slice direction. In the depiction of the k-space shown on the right, the k-space points filled in this way are depicted as hatched going from the top left to the bottom right.

Calibration data for separating measurement data acquired in collapsed form can in each case be created from both the hatched k-space points filled with reference data acquired with sampling patterns with i=1 and i=2 going from bottom left to top right, and from the hatched k-space points filled with reference data acquired with sampling patterns with i=3 and i=4 going from top left to bottom right.

For purposes of clarity, only the first two sampling patterns A1.2 and A2.2 that repeat the sampling patterns A1.1 and A2.1 are shown for the second repetition m=2. However, it is also possible for the sampling patterns A3.1 and A4.1 to be repeated again.

As is evident in the depiction of the k-space on the right, a combination of reference data acquired in accordance with sampling patterns with i=1, i=2, i=3 and i=4 results overall in a completely filled k-space on the basis of which replenishment data can also be created as described above.

For other acceleration factors and/or field of view shift factors, such a permutation the k-space points exposed to additional phases can be performed analogously for each sampling pattern, wherein the number k of repetition required for, at least in regions, full sampling depends on the acceleration factors and field of view shift factors used.

Figure 5:
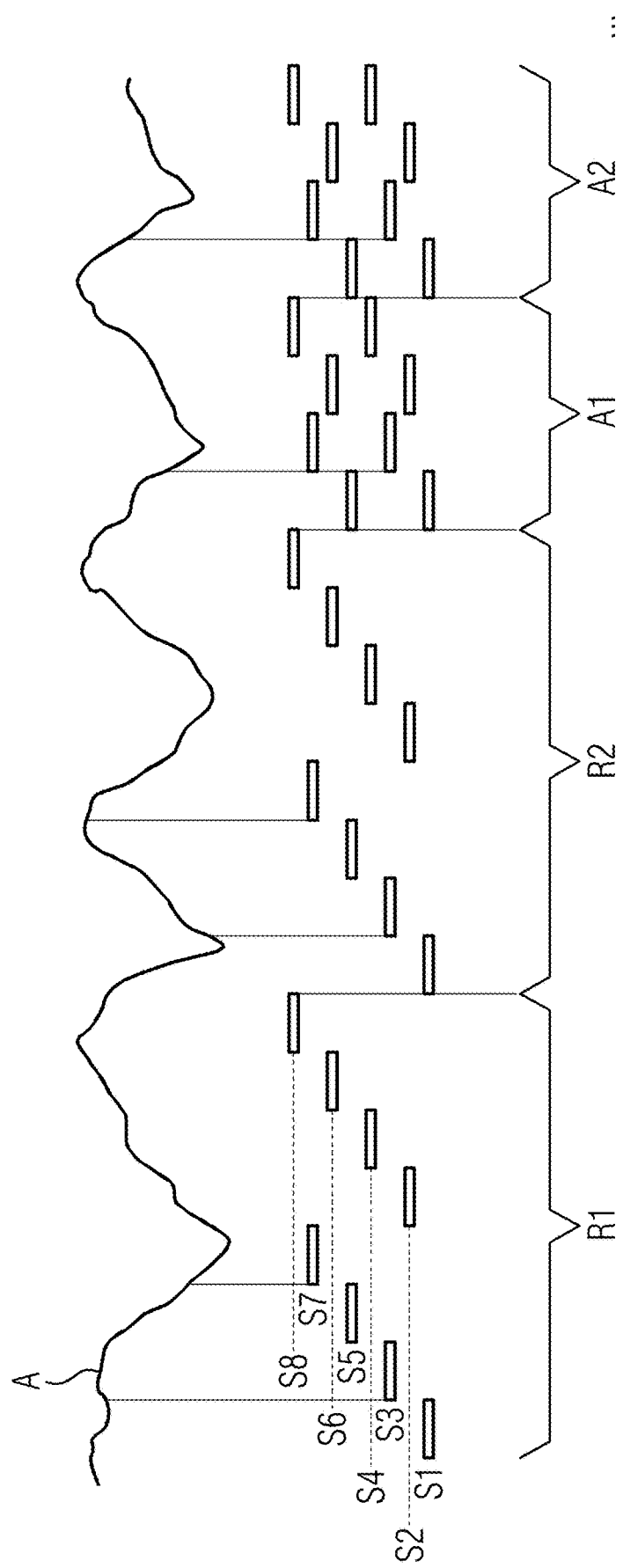
FIG. 5 shows an example course of the acquisition of reference data and measurement data.

FIG. 5 is a schematic view of the temporal course of a slice multiplexing measurement in relation to a physiological motion A of the respective object under examination. The physiological motion A can in particular be a respiratory motion.

Herein, initially in the first time window R1, reference data is acquired from eight stacked slices S1, S2, S3, S4, S5, S6, S7 and S8, for example for calibration data to separate measurement data acquired in collapsed form from the slices S1 to S8. After this, in a further time window R2 further reference data can be acquired, for example for replenishment data for incompletely acquired single-slice measurement data. Subsequently, a slice multiplexing method is used to acquire measurement data in collapsed form in the acquisition time windows A1 and A2 in each case from two of the slices, for example from the slices S1 and S5, S2 and S6, S3 and S7 and S4 and S8, which is separated into single-slice measurement data by means of calibration data acquired on the basis of the reference data acquired in the time window R1 and can be replenished by means of the replenishment data created on the basis of the reference data acquired in the time window R2 to produce complete single-slice measurement data before the latter can be reconstructed to produce image data for the individual slices.

However, as shown, it may be the case that the reference data acquired from a slice was acquired at another state of motion of the physiological motion A than the subsequently acquired measurement data. By way of example, to elucidate this effect, vertical dashed lines for all acquisitions of data from the slice S3 and the slice S7 are plotted up to the associated time points on the curve of the physiological motion A. As shown, a different state of the physiological motion is present for each of the acquisitions, in particular at the acquisition time points of reference data in the time windows R1 and R2 in each case different state of motion are present for the reference data acquired for slice S3 than for the reference data acquired for slice S7, while, as a result of the collapsed acquisition of the measurement data for these two slices, in each case the same state of motion is present for these two slices on the acquisition of the measurement data. This results in errors on the separation of the measurement data acquired in collapsed form and on the replenishment of incomplete single-slice measurement data.

Figure 6:
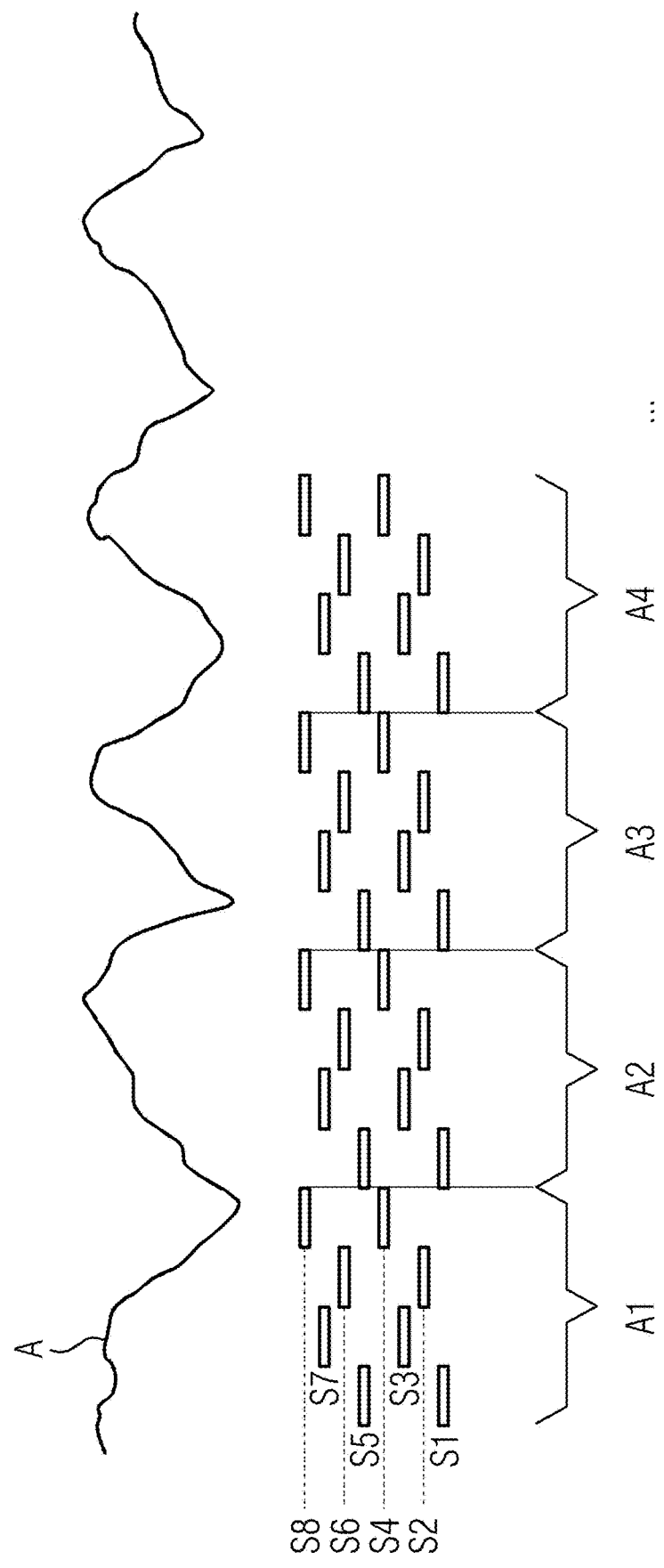
FIG. 6 shows of a course of the acquisition of reference data and measurement data according to an exemplary embodiment of the method according to the disclosure.

FIG. 6 now shows an acquisition of measurement data and reference data for the slices S1, S2, S3, S4, S5, S6, S7 and S8 in an exemplary embodiment of the method according to the disclosure.

In the example shown, reference data is already acquired in collapsed form as measurement data from two slices in each case. This shows four successive acquisitions of reference data (and hence simultaneously measurement data) in acquisition windows A1, A2, A3 and A4. These can also be followed by further acquisition windows. According to the disclosure, different sampling patterns are employed in the different acquisition windows.

For example, the sampling patterns A1.1, A2.1, A1.2 and A2.2 described in FIG. 3 could be used in the acquisition time windows A1 to A4 in succession in order to acquire reference data on the basis of which calibration data to separate the measurement data can be created.

It is also possible to use the sampling patterns A1.1, A2.1, A3.1 and A4.1 described in FIG. 4 in the acquisition time windows A1 to A4 in succession in order to acquire reference data on the basis of which calibration data to separate the measurement data and also replenishment data to replenish incomplete single-slice measurement data can be created.

The simultaneous acquisition of reference data and measurement data can achieve a particularly effective compensation of the physiological motion A, since the reference data and the measurement data are in each case inherently acquired at the same states of motion. This applies to each repetition Ai.m.

It is however also conceivable, for example in the first acquisition time windows, for example A1 and A2, for reference data only to be acquired in collapsed form in each case from two of the eight slices S1 to S8 to be measured, and for measurement data only to be acquired later, for example in acquisition time windows A3 and A4 (and possibly further windows), wherein advantageously, however, the reference data is in each case acquired in collapsed form from the same slices from which the measurement data is also acquired in collapsed form. For example, both reference data and measurement data can be acquired in each case in collapsed form from the slices S1 and S5, S2 and S6, S3 and S7 and S4 and S8. As a result, the reference data that was acquired in collapsed form from two slices is already acquired during the same state of motion. The subsequently acquired measurement data, which was acquired from the same slices as the reference data acquired in collapsed form, was also acquired at the same state of motion. As a result, at least reference data acquired in collapsed form and measurement data acquired in collapsed form for the same slices are in each case acquired at the same state of motion thus enabling a significant reduction in errors due to different states of motion in reference data (from one another) and/or measurement data for the same slices.

Such a separate acquisition of the reference data, in particular with the same repetition time TR as with a subsequent acquisition of measurement data, can advantageously be used to establish a desired steady state for which it would otherwise be necessary to use so-called "dummy scans". This ensures that the overall measurement time is not prolonged by the separate acquisition of the reference data.

Hence, it is also possible to enable robust calibration data and optionally replenishment data for slice multiplexing methods to be created in the region of interest of an object under examination that is subjected to a physiological motion without restricting the physiological motion.

Figure 7:
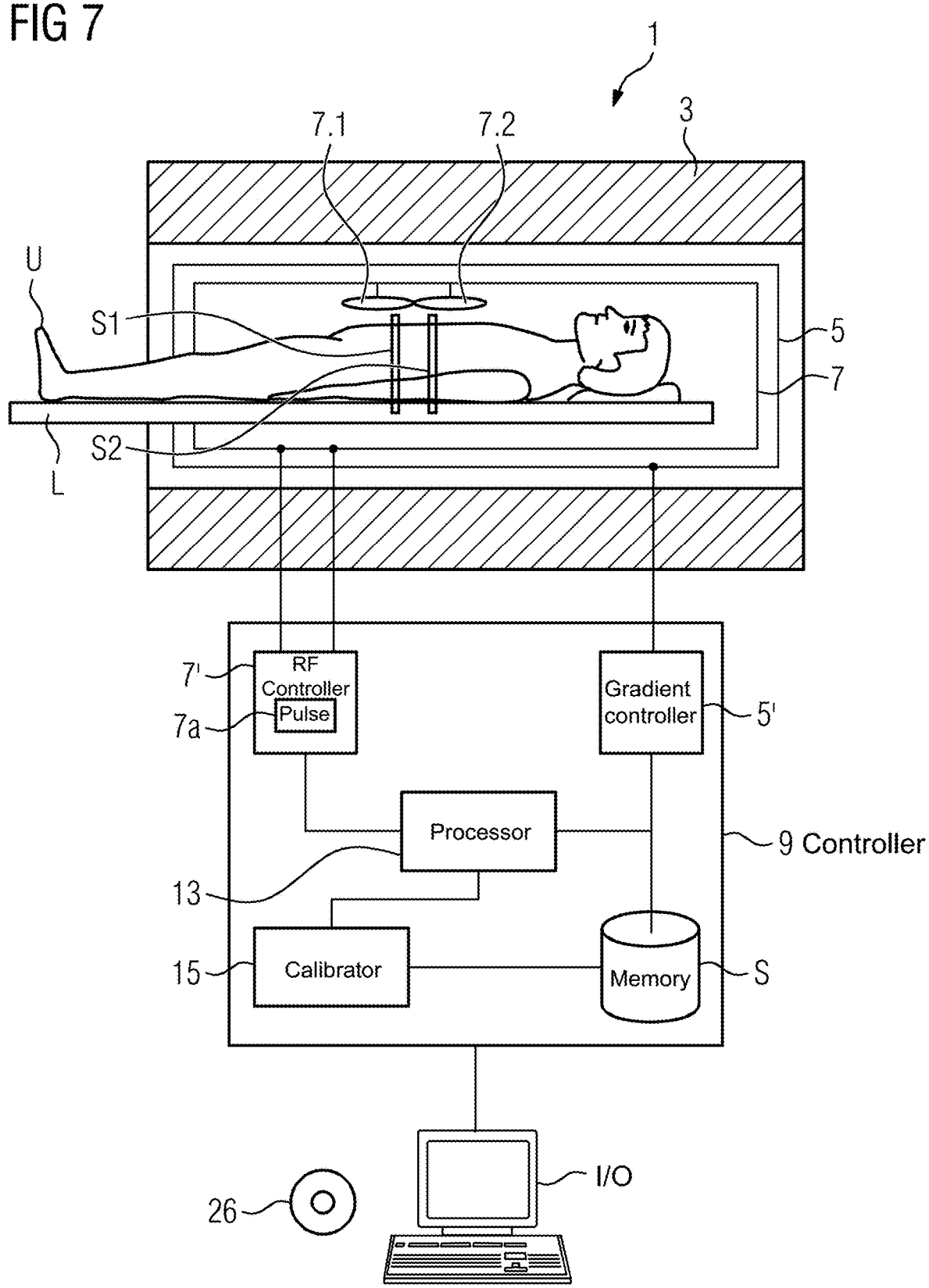
FIG. 7 shows a magnetic resonance system according to an exemplary embodiment of the disclosure.

FIG. 7 is a schematic depiction of a magnetic resonance (MR) system 1 according to an exemplary embodiment of the disclosure. In an exemplary embodiment, the MR system 1 includes a magnet 3 configured to generate the basic magnetic field, a gradient field generator 5 configured to generate the gradient fields, also for the diffusion weighting with different b-values in desired diffusion directions, a radio-frequency (RF) unit (i.e. RF transceiver) 7 configured to apply and receive radio-frequency (RF) signals, and a controller 9 configured to perform a method according to one or more aspects of the disclosure. In FIG. 7, these sub-units of the magnetic resonance system 1 are only depicted in rough schematic form. In particular, the radio-frequency unit 7 consists of a plurality of sub-units, in particular at least two coils such as the schematically indicated coils 7.1 and 7.2, which may be embodied to transmit radio-frequency signals or only to receive the radio-frequency signals triggered or to do both.

In order to examine an object under examination U, for example a patient or a phantom, the object can be introduced into the measurement volume of the magnetic resonance system 1 on a bench L. The slices S1 and S2 represent by way of example two different slices S1 and S2 of the object under examination, which can be measured simultaneously on an acquisition of MR signals.

In an exemplary embodiment, the controller 9 is configured to control the magnetic resonance system 1. In an exemplary embodiment, the controller 9 includes a gradient controller 5' and a radio-frequency transmission/reception controller 7'. The controller 9 can control the gradient field generator 5 using the gradient controller 5' and the radio-frequency unit 7 using the radio-frequency transmission/reception controller 7'. In an exemplary embodiment, the radio-frequency unit 7 can include a plurality of channels on which signals can be transmitted or received. In an exemplary embodiment, the controller 9 (or one or more components therein) includes processor circuitry that is configured to perform one or more respective functions and/or operations of the controller 9 (or the respective component(s)).

Together with its radio-frequency transmission/reception controller 7', the radio-frequency unit 7 is responsible for the generation and the application (transmission) of an alternating radio-frequency field for the manipulation of the spins in a region to be manipulated (in particular into different slices S1 and S2) of the object under examination U. Herein, the center frequency of alternating radio-frequency field, also referred to as the B1 field, should be close to the resonant frequency of the spins to be manipulated. In order to generate the B1 field, currents controlled in the radio-frequency unit 7 by means of the radio-frequency transmission/reception controller 7' are applied to the HF coils. A multiband RF pulse unit 7a, which can, for example, be a component of the radio-frequency transmission/reception controller 7', calculates multiband RF pulses for the simultaneous manipulation of different slices S1, S2 in the object under examination U.

In an exemplary embodiment, the controller 9 also includes a calibrator 15 configured to determine calibration data to separate measurement data acquired in collapsed form from at least two slices and/or to determine replenishment data for replenishing incomplete single-slice measurement data.

A processor 13 that is a component of the controller 9 is configured to carry out all the computing operations required for the measurements and determinations. Interim results and results required for this can be stored in a memory storage unit (i.e. memory) S of the controller 9. Hereby, the units depicted should not necessarily be understood to be physically separate units but only constitute a subdivision into logic units, which, can, however, also be implemented in more or fewer units or even in only one single physical unit.

A user, for example, can use an input/output facility E/A of the magnetic resonance system 1 to send control commands to the magnetic resonance system and/or to display results from controller 9 such as, for example, image data.

A method described herein can also be present in the form of a computer program product that includes a program and implements the described method on a controller 9 when it is executed on the controller 9. An electronically readable data carrier 26 can also be provided with electronically readable control information stored thereupon, which includes at least one such above-described computer program product and is embodied to carry out the described method when the data carriers 26 is used in a controller 9 of a magnetic resonance system 1.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or nonvolatile memory, including, for example, read-only memory (ROM), random access memory (RAM), flash memory, a magnetic storage media, an optical disc, erasable programmable read only memory (EPROM), and programmable read only memory (PROM). The memory can be nonremovable, removable, or a combination of both.

The invention claimed is:

1. A method for generating measurement data from an object under examination subjected to physiological motion using a slice multiplexing magnetic resonance technique, the method comprising:
    repeatedly applying at least one radio-frequency (RF) excitation pulse and switching gradients to generate echo signals in at least two slices by switched gradients and applied RF excitation pulses, wherein the echo signals generated are acquired in k-space and stored as reference data in one respective reference dataset per repetition in accordance with one different three-dimensionally viewed sampling pattern per repetition, each sampling pattern employed being undersampled according to Nyquist criterion, and wherein, at least in a central region, a combination of the sampling patterns employed in the repetitions completely includes k-space, at least in the slice direction;
    determining calibration data based on the complete central region of combined reference datasets at least in the slice direction; and
    separating measurement data acquired in collapsed form from the at least two slices into single-slice measurement data based on the calibration data.

2. The method as claimed in claim 1, further comprising: undersampling, in the phase encoding direction, the complete central region of the combined reference datasets to determine the calibration data.

3. The method as claimed in claim 1, wherein reference datasets acquired as the measurement data acquired in collapsed form are separated into single-slice measurement data from which single-slice images are reconstructable.

4. The method as claimed in claim 1, wherein the RF excitation pulses are multiband RF excitation pulses for simultaneous excitation of the at least two slices.

5. The method as claimed in claim 1, further comprising:
    performing at least one further repetition including application of the at least one RF excitation pulse and switching of gradients to generate the echo signals in the at least two slices;
    acquiring and storing, for each of the at least one further repletion, the generated echo signals as reference data in respective further reference datasets based on at least one previously used sampling pattern; and
    determining further calibration data based on the stored further reference data sets to separate measurement data acquired in collapsed form from at least two slices.

6. The method as claimed in claim 5, wherein the echo signals are generated based on all previously used sampling patterns.

7. The method as claimed in claim 5, wherein the determination of the further calibration data is based on previously determined calibration data.

8. The method as claimed in claim 1, wherein the repeatedly applying of the at least one RF excitation pulse and the switching of the gradients to generate the echo signals is repeated with an application of different RF excitation pulses and switching of different gradients according to a respective different three-dimensionally viewed sampling pattern in each repetition until, at least in the central region, a combination of the different three-dimensionally viewed sampling patterns employed in all repetitions completely including k-space, and being based on a completely acquired central region, and wherein replenishment data is determined for replenishment of incomplete single-slice measurement data.

9. The method as claimed in claim 1, wherein the reference datasets are acquired with different diffusion weighting.

10. The method as claimed in claim 9, wherein the reference datasets are acquired with different diffusion weighting based on an echo planar (EPI) sequence.

11. The method as claimed in claim 1, wherein the reference datasets are acquired with smallest b-values corresponding at most to a number of the least two slices from which measurement data is acquired in collapsed form for b-values used for diffusion weighting of the measurement data to be separated.

12. The method as claimed in claim 11, wherein the reference datasets are acquired based on an echo planar (EPI) sequence.

13. A non-transitory computer-readable storage medium with an executable program stored thereon, that when executed, instructs a processor to perform the method of claim 1.

14. A computer program product having a computer program which is directly loadable into a memory of a controller of the magnetic resonance device, when executed by the controller, causes the magnetic resonance device to perform the method as claimed in claim 1.

15. A magnetic resonance system comprising:
a magnet configured to generate a basic magnetic field;
a gradient field generator configured to generate gradient fields;
a radio-frequency (RF) transceiver configured to apply and receive radio-frequency signals; and
a controller configured to:
repeatedly apply at least one radio-frequency (RF) excitation pulse and switching gradients to generate echo signals in at least two slices by switched gradients and applied RF excitation pulses, wherein the echo signals generated are acquired in k-space and stored as reference data in one respective reference dataset per repetition in accordance with one different three-dimensionally viewed sampling pattern per repetition, each sampling pattern employed being undersampled according to Nyquist criterion, and wherein, at least in a central region, a combination of the sampling patterns employed in the repetitions completely includes k-space, at least in the slice direction;
determine calibration data based on the complete central region of combined reference datasets at least in the slice direction; and
separate measurement data acquired in collapsed form from the at least two slices into single-slice measurement data based on the calibration data.

16. The magnetic resonance system according to claim 15, wherein the controller comprises: a radio-frequency controller configured to control the RF transceiver, and a calibrator configured to determine calibration data to separate measurement data acquired in collapsed form from at least two slices and/or to determine replenishment data for replenishing incomplete single-slice measurement data.

* * * * *